US011565347B2

(12) United States Patent  
Nomaru et al.

(10) Patent No.: US 11,565,347 B2  
(45) Date of Patent: Jan. 31, 2023

(54) LASER PROCESSING MACHINE

(71) Applicant: DISCO CORPORATION, Tokyo (JP)

(72) Inventors: Keiji Nomaru, Tokyo (JP); Yuji Hadano, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 144 days.

(21) Appl. No.: 17/066,714

(22) Filed: Oct. 9, 2020

(65) Prior Publication Data

US 2021/0129265 A1 May 6, 2021

(30) Foreign Application Priority Data

Oct. 30, 2019 (JP) .............................. JP2019-197164

(51) Int. Cl.
*B23K 26/146* (2014.01)  
*B23K 26/0622* (2014.01)  
(Continued)

(52) U.S. Cl.
CPC .......... *B23K 26/146* (2015.10); *B23K 26/064* (2015.10); *B23K 26/0608* (2013.01);  
(Continued)

(58) Field of Classification Search
CPC ............ B23K 2101/40; B23K 26/0853; B23K 2103/56; B23K 2103/50; B23K 26/40;  
(Continued)

(56) References Cited

U.S. PATENT DOCUMENTS

| 6,509,548 B1 | 1/2003 | Troitski |
| 2006/0086704 A1* | 4/2006 | Nagai .................. B23K 26/067 |
| | | 219/121.72 |

(Continued)

FOREIGN PATENT DOCUMENTS

| JP | 10305420 A | 11/1998 |
| JP | 2002192370 A | 7/2002 |

(Continued)

OTHER PUBLICATIONS

DE 10 2020 213 612.2; Translated German Office Action dated Sep. 16, 2022 (5 pages).

*Primary Examiner* — Chris Q Liu  
(74) *Attorney, Agent, or Firm* — Greer, Burns & Crain, Ltd.

(57) ABSTRACT

A laser processing machine includes a condenser and a water pillar forming unit. The condenser condenses a laser beam emitted from a laser oscillator and irradiates it to a workpiece held on a chuck table. The water pillar forming unit is disposed on a lower end of the condenser and is configured to form a thread-shaped water pillar on a front side of the workpiece. The laser oscillator includes a first laser oscillator, which emits a first laser beam having a short pulse width, and a second laser oscillator, which emits a second laser beam having a long pulse width. After the laser beams emitted from the first and second laser oscillators have transmitted through the thread-shaped water pillar formed by the water pillar forming unit and have been irradiated to the workpiece, a plasma occurred in the water pillar forming unit applies processing to the workpiece.

6 Claims, 5 Drawing Sheets

(51) Int. Cl.
 *B23K 26/06*    (2014.01)
 *B23K 26/08*    (2014.01)
 *B23K 26/142*    (2014.01)
 *B23K 26/064*    (2014.01)
 *H01L 21/67*    (2006.01)
 *B23K 103/00*    (2006.01)
 *B23K 101/18*    (2006.01)

(52) U.S. Cl.
 CPC ...... *B23K 26/0622* (2015.10); *B23K 26/0648* (2013.01); *B23K 26/0665* (2013.01); *B23K 26/08* (2013.01); *B23K 26/142* (2015.10); *H01L 21/67092* (2013.01); *H01L 21/67115* (2013.01); *B23K 2101/18* (2018.08); *B23K 2103/56* (2018.08)

(58) Field of Classification Search
 CPC .. B23K 26/032; B23K 26/067; B23K 26/364; B23K 26/0676; B23K 26/082; B23K 26/38; B23K 26/0622; B23K 26/0673; B23K 26/0821; B23K 26/0823; B23K 26/083; B23K 26/0869; B23K 26/382; B23K 26/53; B23K 26/0006; B23K 26/048; B23K 26/0613; B23K 26/0624; B23K 26/0626; B23K 26/064; B23K 26/0648; B23K 26/0665; B23K 26/146; B23K 26/16; B23K 26/359; B23K 26/50; B23K 26/702; B23K 2101/42; B23K 2103/172; B23K 2103/52; B23K 2103/54; B23K 26/009; B23K 26/03; B23K 26/0604; B23K 26/0643; B23K 26/073; B23K 26/0736; B23K 26/0861; B23K 26/0876; B23K 26/0884; B23K 26/122; B23K 26/142; B23K 26/351; B23K 26/402; B23K 26/57; B23K 26/704; B23K 26/705
 USPC ............ 219/121.67, 121.77, 121.68, 121.73, 219/121.75, 121.72, 121.76, 243, 121.84
 See application file for complete search history.

(56) References Cited

U.S. PATENT DOCUMENTS

| | | | |
|---|---|---|---|
| 2007/0023691 A1* | 2/2007 | Morishige | B23K 26/083 250/492.1 |
| 2011/0042362 A1* | 2/2011 | Maehara | B23K 26/142 219/121.67 |
| 2011/0084050 A1* | 4/2011 | Togashi | B23K 26/0853 219/121.75 |
| 2012/0298649 A1* | 11/2012 | Nagata | B23K 26/146 219/243 |
| 2018/0211851 A1* | 7/2018 | Kaminaga | B26D 5/005 |

FOREIGN PATENT DOCUMENTS

| | | |
|---|---|---|
| JP | 2004188475 A | 7/2004 |
| JP | 2011251321 A | 12/2011 |
| JP | 2011251323 A | 12/2011 |
| JP | 2013146747 A | 8/2013 |
| JP | 2014221483 A | 11/2014 |

* cited by examiner

LASER PROCESSING MACHINE

BACKGROUND OF THE INVENTION

Field of the Invention

The present invention relates to a laser processing machine including a chuck table configured to hold a plate-shaped workpiece, a laser beam irradiation unit configured to irradiate a laser beam to the workpiece held on the chuck table so that processing is applied to the workpiece, and a processing feed mechanism configured to perform relative processing feed of the chuck table and the laser beam irradiation unit.

Description of the Related Art

A wafer, on a front side of which a plurality of devices such as integrated circuits (ICs), large scale integrated circuits (LSIs) or the like are formed and defined by a plurality of intersecting streets, is divided into the individual devices by a laser processing machine, and the thus-divided device chips are used in electrical equipment such as mobile phones, personal computers, lighting equipment or the like. On the other hand, there are a variety of types of laser processing machines, including: a type that irradiates to a workpiece a laser beam of a wavelength having absorption in the workpiece to apply ablation processing to the workpiece so that grooves are formed as starting points for division (see, for example, JP H10-305420 A), another type that irradiates to a workpiece a laser beam of a wavelength having transmissivity through the workpiece with a focal point thereof positioned inside the workpiece, thereby forming a modified layer as a starting point for division inside the workpiece (see, for example, Japanese Patent No. 3408805), and a further type that irradiates to a workpiece a laser beam of a wavelength having transmissivity through the workpiece with a focal point thereof positioned inside the workpiece, thereby forming, as starting points for division, a plurality of shield tunnels each being formed of a fine hole and an amorphous region surrounding the fine hole (see, for example, JP 2014-221483 A). Depending on the kind of a workpiece, a required processing accuracy, and the like, a desired laser processing machine is chosen for use.

In the type that applies ablation processing to a workpiece, debris pieces may scatter around from its sites to which a laser beam is irradiated, and may stick to devices formed on the front side of the workpiece, thereby raising a problem that the devices may be degraded in quality. To prevent such sticking of debris particles, it has hence been also proposed to apply a liquid resin to the front side of a wafer before performing laser processing (see, for example, JP 2004-188475 A).

SUMMARY OF THE INVENTION

If a liquid resin is applied before performing laser processing on a workpiece as described above, the liquid resin is discarded without reuse after the laser processing, leading to problems that such a technique is uneconomical and has a low productivity due to the need for application and removal steps for the liquid resin.

Further, it has also been investigated to prevent debris particles from sticking to the front side of a wafer by irradiating a laser beam to the wafer with the wafer immersed in water and causing the debris particles to float in the water. However, indications have been made about a problem that the laser beam is scattered by bubbles and cavitation occurred in the water, resulting in a failure to perform desired processing. In addition, a further problem has also been found that individually divided chips have a lowered flexural strength due to effects of heat.

The present invention therefore has as an object thereof the provision of a laser processing machine, which can prevent scattering of debris pieces without lowering the productivity and can perform appropriate laser processing without causing scattering of a laser beam.

In accordance with an aspect of the present invention, there is provided a laser processing machine including a chuck table configured to hold a plate-shaped workpiece, a laser beam irradiation unit configured to irradiate a laser beam to the workpiece held on the chuck table so that processing is applied to the workpiece, and a processing feed mechanism configured to perform relative processing feed of the chuck table and the laser beam irradiation unit. The laser beam irradiation unit includes a laser oscillator that emits the laser beam, a condenser that condenses the laser beam emitted from the laser oscillator and irradiates to the workpiece held on the chuck table, and a water pillar forming unit disposed on a lower end of the condenser and configured to form a thread-shaped water pillar on a front side of the workpiece. The laser oscillator includes a first laser oscillator, which emits a first laser beam having a short pulse width, and a second laser oscillator, which emits a second laser beam having a long pulse width, whereby, after the first laser beam emitted from the first laser oscillator and the second laser beam emitted from the second laser oscillator have transmitted in the thread-shaped water pillar and have been irradiated to the workpiece, a plasma produced by the first laser beam emitted from the first laser oscillator grows by absorption of energy from the second laser beam emitted from the second laser oscillator, and applies processing to the workpiece.

Preferably, the water pillar forming unit includes a casing and a pressurized water introducing portion that introduces pressurized water into the casing, the casing having a top wall which faces an object lens configuring the condenser, a bottom wall which opposes the top wall and includes an ejection hole formed therethrough, and a side wall surrounding a space formed by the top wall and the bottom wall, and the first laser beam and the second laser beam are guided by the thread-shaped water pillar ejected from the ejection hole formed through the bottom wall, and are irradiated to the workpiece.

According to the present invention, the sticking of debris particles can be prevented without applying a liquid resin to the front side of a wafer, thereby enabling to cut off the cost of the liquid resin and also to save the labor involved in applying the liquid resin to the front side of the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
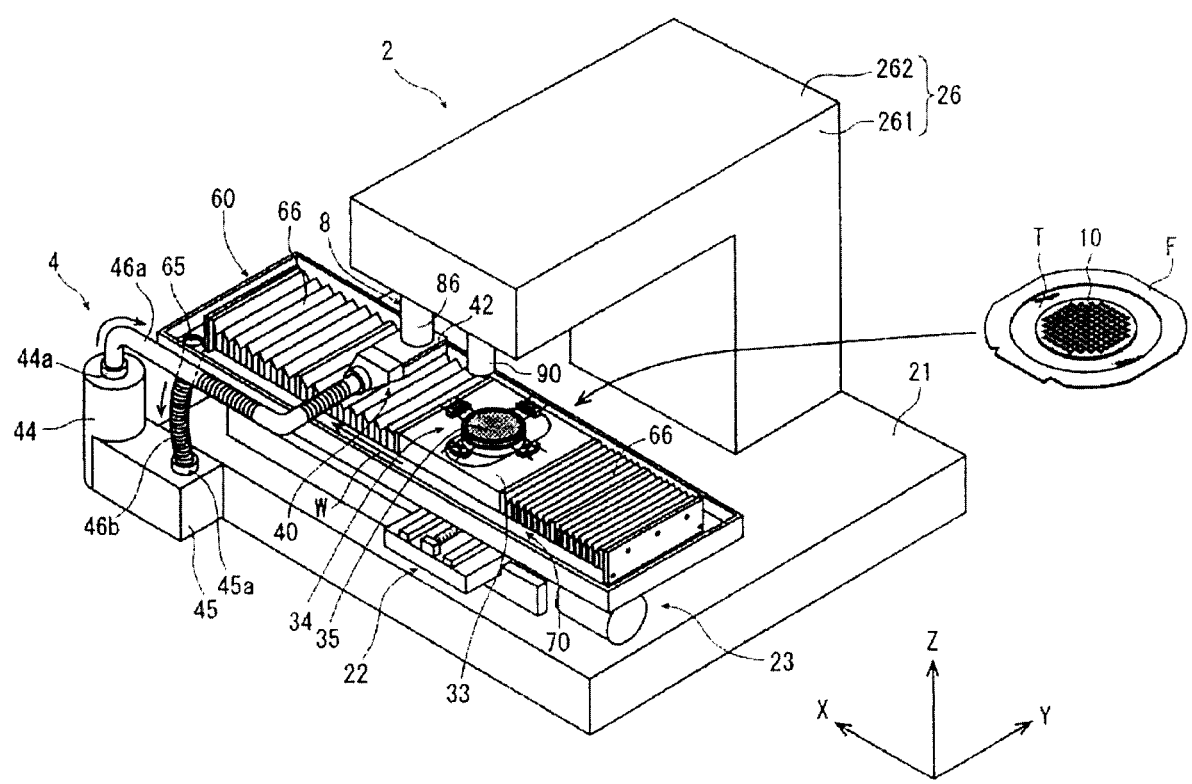
FIG. 1 is a perspective view of a laser processing machine according to an embodiment of the present invention.

With reference to the attached drawings, a description will hereinafter be made in detail about a laser processing machine according to an embodiment of the present invention. FIG. 1 is a perspective view of the laser processing machine 2 of this embodiment. The laser processing machine 2 includes a water supply system 4 disposed on a bed 21 and configured to supply water onto a plate-shaped workpiece (for example, a silicon-made wafer 10), a laser beam irradiation unit 8 configured to irradiate a laser beam to the plate-shaped workpiece, a holding unit 22 configured to hold the workpiece, a moving mechanism 23 configured to perform a relative movement of the laser beam irradiation unit 8 and the holding unit 22, and a frame body 26 formed from a vertical wall portion 261, which is disposed upright in a Z direction indicated by an arrow Z on the bed 21 beside the moving mechanism 23, and a horizontal wall portion 262, which extends in a horizontal direction from an upper end portion of the vertical wall portion 261.

Inside the horizontal wall portion 262 of the frame body 26, an optical system which will be described in detail subsequently herein is accommodated. The optical system configures the laser beam irradiation unit 8 that irradiates a laser beam to the wafer 10 held on the holding unit 22. On the side of a lower surface of a distal end portion of the horizontal wall portion 262, a condenser 86 that configures a portion of the laser beam irradiation unit 8 is disposed, and an alignment unit 90 is also disposed at a location adjacent the condenser 86 in an X direction indicated by an arrow X in the figure.

The alignment unit 90 is used to image the wafer 10 held on a chuck table 34, which makes up the holding unit 22, and to detect a position where laser processing is to be applied. The alignment unit 90 includes an imaging element (charge-coupled device (CCD)) that uses a visible beam to image the front side of the wafer 10. Depending on the material that forms the wafer 10, the alignment unit 90 may preferably include infrared ray irradiation means for irradiating an infrared ray, an optical system that captures the infrared ray irradiated by the infrared ray irradiation means and reflected on the front side of the wafer 10, and an imaging element (infrared CCD) that outputs an electrical signal corresponding to the infrared ray captured by the optical system.

As depicted in the figure, the wafer 10 is supported, for example, on an annular frame F via an adhesive table T, and is held under suction on a suction chuck 35 that makes up an upper surface of the chuck table 34. The above-described laser processing machine 2 is covered in its entirety by a housing or the like a depiction of which is omitted in the figure for the convenience of description, and is configured to prevent penetration of fine powder, dust, and the like thereinto.

Figure 2:
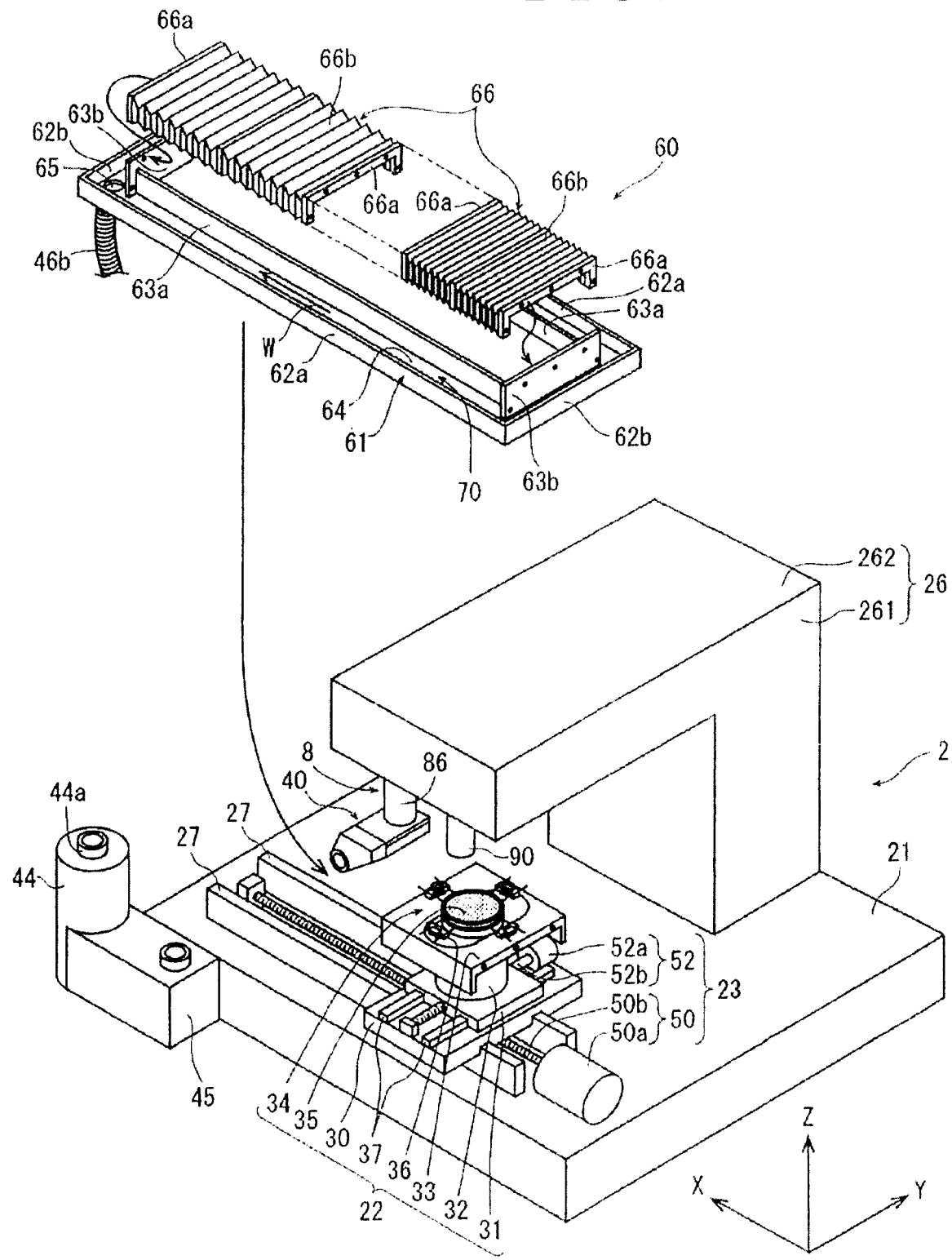
FIG. 2 is an exploded perspective view of the laser processing machine depicted in FIG. 1, with a portion of the laser processing machine being depicted in an exploded fashion.

Referring to FIG. 2 in addition to FIG. 1, a description will be made in detail about the laser processing machine 2 according to this embodiment. FIG. 2 is a perspective view depicting the laser processing machine 2 of FIG. 1, in which a water recovery pool 60 that configures a section of the water supply system 4 has been detached from the laser processing machine 2 and a part of the detached section is depicted in an exploded fashion.

The holding unit 22 includes, as depicted in FIG. 2, a rectangular X-direction moving plate 30 mounted on the bed 21 movably in the X direction indicated by the arrow X, a rectangular Y-direction moving plate 31 mounted on the X-direction moving plate 30 movably in a Y direction indicated by an arrow Y and intersecting the X direction at right angles, a cylindrical post 32 fixed on an upper surface of the Y-direction moving plate 31, and a rectangular cover plate 33 fixed on an upper end of the post 32. On the cover plate 33, the chuck table 34 is disposed extending upward through an elongated hole formed in the cover plate 33. The chuck table 34 is configured to hold the wafer 10 and to be rotatable by undepicted rotary drive means. Configuring the upper surface of the chuck table 34, the suction chuck 35 is disposed. The suction chuck 35 has a circular shape, is formed from a porous material having air permeability, and extends substantially horizontally. The suction chuck 35 is connected to undepicted suction means via a flow passage that extends through the post 32, and four clamps 36 are arranged at intervals around the suction chuck 35. The clamps 36 grip the frame F with the wafer 10 held thereon when fixing the wafer 10 on the chuck table 34. A plane defined by the X direction and the Y direction forms a substantially horizontal plane.

The moving mechanism 23 includes an X-direction moving mechanism 50 and a Y-direction moving mechanism 52. The X-direction moving mechanism 50 converts a rotary motion of a motor 50a to a linear motion via a ball screw 50b, and transmits the linear motion to the X-direction moving plate 30, whereby the X-direction moving plate 30 is advanced or retracted in the X direction along guide rails 27 on the bed 21. The Y-direction moving mechanism 52 converts a rotary motion of a motor 52a to a linear motion via a ball screw 52b, and transmits the linear motion to the Y-direction moving plate 31, whereby the Y-direction moving plate 31 is advanced or retracted in the Y direction along guide rails 37 on the X-direction moving plate 30. Although not depicted in the figures, the chuck table 34, the X-direction moving mechanism 50 and the Y-direction moving mechanism 52 each include position detecting means, and therefore positions of the chuck table 34 in the X and Y directions and an angular position of the chuck table 34 in a peripheral direction are detected accurately. The X-direction moving mechanism 50, the Y-direction moving mechanism 52 and the undepicted rotary drive means for the chuck table 34 are then driven, thereby enabling to accurately position the chuck table 34 at desired positions and angle. The above-described X-direction moving mechanism 50 acts as processing feed means for moving the holding unit 22 in a processing feed direction, and the above-described Y-direction moving mechanism 52 acts as indexing feed means for moving the holding unit 22 in an indexing feed direction.

As depicted in FIG. 1, the water supply system 4 includes a water pillar forming unit 40 that configures water pillar forming means in this embodiment, a water supply pump 44, a filter 45, a water recovery pool 60, a pipe 46a connecting the water pillar forming unit 40 and the water supply pump 44 together, and a pipe 46b connecting the water recovery pool 60 and the filter 45 together. Preferably, the pipe 46a and the pipe 46b may each be formed by a flexible hose in its part or entirety.

Figure 3A:
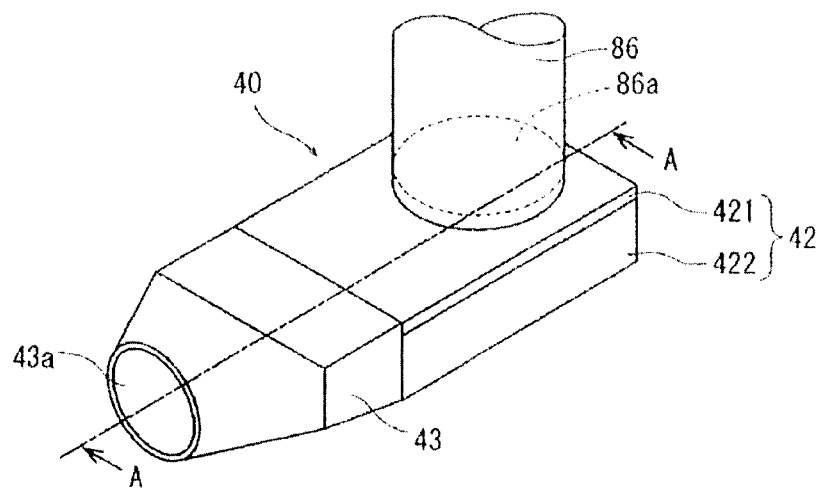
FIG. 3A is a perspective view of a water pillar forming unit mounted on the laser processing machine depicted in FIG. 1.

As depicted in FIG. 3A, the water pillar forming unit 40 is disposed on a lower end portion of the condenser 86. An exploded view of the water pillar forming unit 40 is presented in FIG. 3B. As appreciated from FIG. 3B, the water pillar forming unit 40 includes a casing 42 and a pressurized water introducing portion 43 that introduces pressurized water into the casing 42. The casing 42 has a substantially rectangular shape as seen in plan, and is configured of an upper member 421, which makes up a top wall in this embodiment, and a lower member 422 opposing the upper member 421.

Figure 3B:
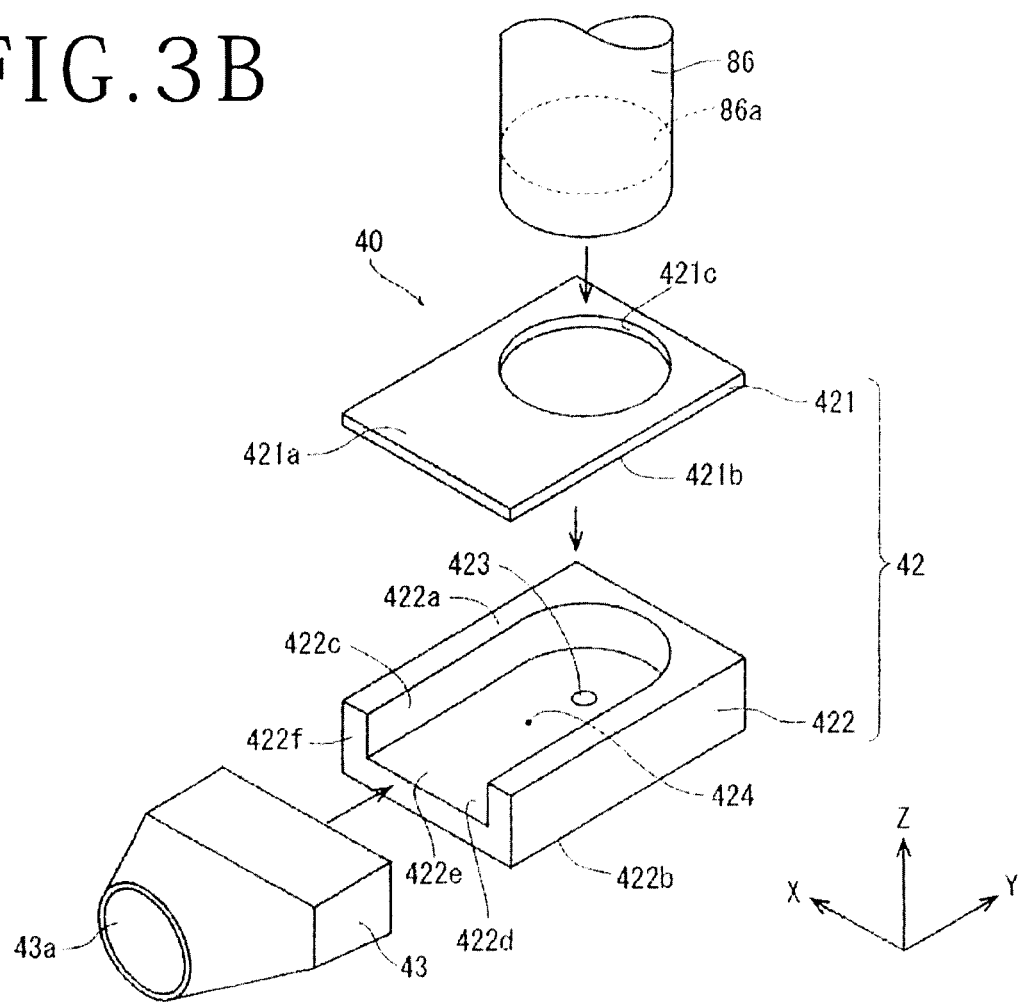
FIG. 3B is an exploded perspective view depicting, in an exploded fashion, the water pillar forming unit depicted in FIG. 3A.

As depicted in FIG. 3B, a circular opening 421c is formed through the upper member 421, extending from the side of an upper surface 421a to the side of a back surface 421b. The condenser 86 is inserted in the opening 421c. The lower member 422 includes a bottom wall 422d and a side wall 422c. The bottom wall 422d is located in a region that opposes the opening 421c of the upper member 421, and has an ejection hole 423 formed therethrough extending to the side of a lower surface 422b of the lower member 422. The side wall 422c surrounds a space 424 formed by the lower surface 421b of the upper member 421 and the bottom wall 422d. In a side wall 422f on a side where the pressurized water introducing portion 43 is connected, a water supply port 422e is formed to supply water to the space 424.

The pressurized water introducing portion 43 includes a supply port 43a through which water W is supplied, and the water pillar forming unit 40 is formed by assembling the pressurized water introducing portion 43 on the side wall 422f, in which the water supply port 422e opens, of the casing 42 from the Y direction.

The water pillar forming unit 40 has such a configuration as described above, and the water W delivered from the water supply pump 44, which has been described based on FIG. 1, is supplied to the water supply port 422e of the casing 42 via the pressurized water introducing portion 43, is allowed to flow through the space 424 of the casing 42, and is ejected from the ejection hole 423 formed in the bottom wall 422d.

Referring back to FIGS. 1 and 2, a description will be made about the water recovery pool 60. As depicted in FIG. 2, the water recovery pool 60 includes an outer frame member 61 and two water covers 66.

The outer frame member 61 includes a pair of outer side walls 62a extending in the X direction indicated by the arrow X in the figures, a pair of outer side walls 62b extending in the Y direction indicated by the arrow Y in the figures, pairs of inner side walls 63a and 63b disposed inside, with a predetermined interval from and in parallel to the outer side walls 62a and 62b, and a bottom wall 64 connecting the outer side walls 62a and 62b and inner side walls 63a and 63b together at lower ends thereof. The outer side walls 62a and 62b, the inner side walls 63a and 63b, and the bottom wall 64 form a rectangular water recovery channel 70, which has long sides extending along the X direction and short sides extending along the Y direction. Inside the inner side walls 63a and 63b that form the water recovery channel 70, an opening is formed extending upward and downward. The bottom wall 64, which forms the water recovery channel 70, has a slight inclination in the X direction and the Y direction. At a corner portion located at the lowest position of the water recovery channel 70 (the left corner portion in the figure), a water drain hole 65 is disposed. The pipe 46b is connected to the water drain hole 65, so that the water drain hole 65 is connected to the filter 45 via the pipe 46b. The outer frame member 61 may preferably be formed in its entirety from a stainless steel plate resistant to corrosion and rusting.

The two water covers 66 each include a resin-made corrugated cover member 66b, and fixing fittings 66a having a flattened square U-shape and fixedly secured on opposite ends of the cover member 66b, respectively. The fixing fittings 66a are formed with dimensions sufficient to straddle the two inner side walls 63a of the outer frame member 61, the two inner side walls 63a being disposed opposing each other in the Y direction. One of the fixing fittings 66a of each water cover 66, specifically the outer fixing fitting 66a as viewed in the X direction is fixed on the inner side wall 63b of the outer frame member 61, the inner side wall 63b opposing the outer fixing fitting 66a in the X direction. The water recovery pool 60 configured as described above is fixed on the bed 21 of the laser processing machine 2 by undepicted fixing means. The cover plate 33 of the holding unit 22 is attached such that the cover plate 33 is held between the inner fixing fittings 66a of the two water covers 66. X-direction end faces of the cover member 33 have the same fattened square U-shape as the inner fixing fittings 66a, and similar to the inner fixing fittings 66a, are dimensioned to straddle the inner side walls 63a of the outer frame member 61 in the Y direction. Therefore, the cover member 33 is attached to the water covers 66 after the outer frame member 61 of the water recovery pool 60 has been disposed on the bed 21. According to the above-described configuration, the cover plate 33 moves along the inner side walls 63a of the water recovery pool 60 when the cover plate 33 is moved in the X direction by the X-direction moving mechanism 50. However, the manner of attachment of the water covers 66 and the cover member 33 is not limited to the above-described procedures. For example, the cover member 33 may be attached beforehand to the water covers 66 prior to the attachment of the two water covers 66 to the inner side walls 63b of the outer frame member 61, and the water covers 66 may then be attached together with the cover member 33 to the outer frame member 61 attached beforehand to the bed 21.

Continuing the description with reference to FIG. 1 again, the water supply system 4 has the above-described configuration so that the water W delivered from a delivery port 44a of the water supply pump 44 is supplied to the water pillar forming unit 40 by way of the pipe 46a. The water W supplied to the water pillar forming unit 40 is ejected downward from the ejection hole 423 formed through the bottom wall 422d of the casing 42 of the water pillar forming unit 40 described based on FIG. 3B. The water W ejected from the water pillar forming unit 40 flows on the cover plate 33 and the water covers 66, and flows down into the water recovery pool 60. The water W, which has flowed down into the water recovery pool 60, flows through the water recovery channel 70, and is collected in the water drain hole 65 disposed at the lowest position of the water recovery channel 70. The water W collected in the water drain hole 65 is guided to the filter 45 by way of the pipe 46b, and subsequent to removal of laser swarf (debris particles), fine powder, dust, and the like at the filter 45, is returned to the water supply pump 44. Therefore, the water W delivered from the water supply pump 44 circulates in the water supply system 4.

Figure 4:
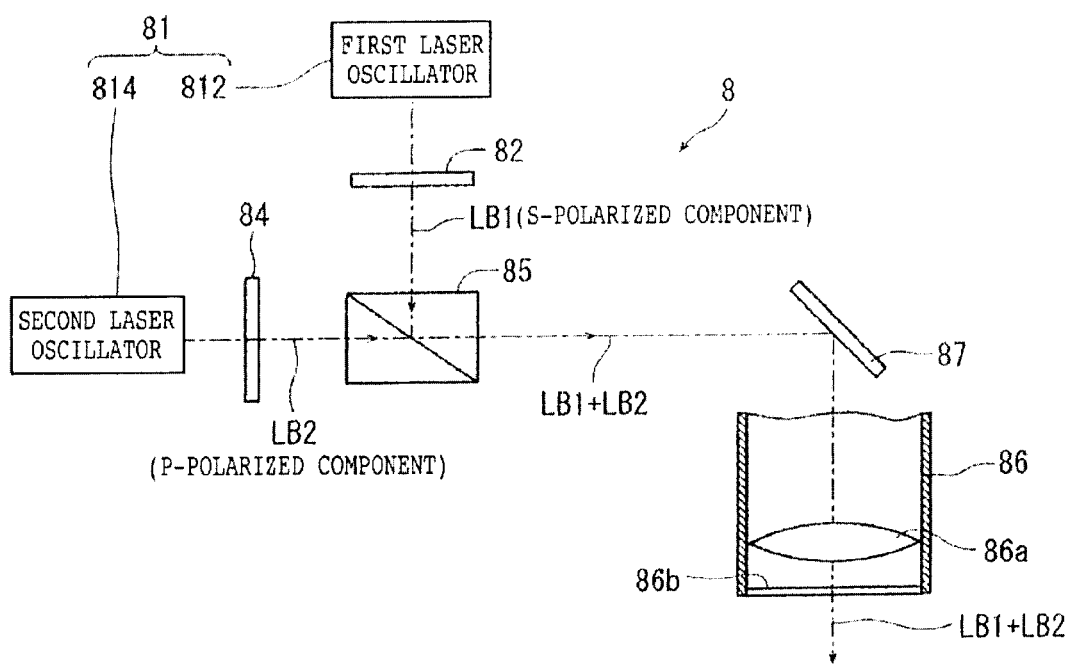
FIG. 4 is a block diagram for describing an optical system of a laser beam irradiation unit mounted on the laser processing machine depicted in FIG. 1.

FIG. 4 is a block diagram illustrating the outline of the optical system of the laser beam irradiation unit 8. As illustrated in FIG. 4, the laser beam irradiation unit 8 includes a laser oscillator 81, a half-wave plate 82, a half-wave plate 84, a polarizing beam splitter 85, a reflection mirror 87, and the condenser 86. The laser oscillator 81 includes a first laser oscillator 812 that emits a first laser beam LB1 as a pulsed laser beam having a short pulse width, and a second laser oscillator 814 that emits a second laser beam LB2 as a pulsed laser beam having a long pulse width. The half-wave plate 82 imparts a phase difference of ½ wavelength to the first laser beam LB1 entered thereinto, and rotates the polarization direction of a linearly polarized laser beam. The half-wave plate 84 imparts a phase difference of ½ wavelength to the second laser beam LB2 entered thereinto, and rotates the polarization direction of a linearly polarized laser beam. The polarizing beam splitter 85 reflects an S-polarized component of the first laser beam LB1 passed through the half-wave plate 82, allows a P-polarized component of the second laser beam LB2 passed through the half-wave plate 84, combines the reflected S-polarized component of the first laser beam LB1 and the passed P-polarized component of the second laser beam LB2 so as to irradiate them to the same point on the wafer 10, and outputs them as a laser beam LB1+LB2. The reflection mirror 87 changes by 90° the irradiation direction of the laser beam LB1+LB2 outputted from the polarizing beam splitter 85. The condenser 86 condenses the laser beam LB1+LB2, and irradiates it to the wafer 10 held on the holding unit 22. The first laser oscillator 812 and the second laser oscillator 814 oscillate, for example, lasers of wavelengths having absorption in the wafer 10. Although not illustrated in the figure, the optical system of the laser beam irradiation unit 8 may also include attenuators to change the outputs of the individual laser beams, reflection mirrors to change the optical paths of the individual laser beams, and the like, as needed.

Inside the condenser 86, an object lens 86a is disposed to focus and irradiate the laser beam LB1+LB2 to the wafer 10. The object lens 86a is located below the above-described reflection mirror 87, and condenses and irradiates the laser beam LB1+LB2 reflected by the reflection mirror 87. On the lower end portion of the condenser 86, a glass member 86b is disposed so that the lower end portion of the condenser 86 is closed by the glass member 86b. The glass member 86b transmits the above-described laser beam LB1+LB2, and prevents the pressurized water W, which is introduced into the space 424 of the casing 42, from entering the condenser 86. Instead of closing the lower end portion of the condenser 86 by the glass member 86b, the opening 421c formed in the upper member 421 of the casing 42 may be closed by a similar glass member on the side of a lower surface of the upper member 421. In addition, the laser beam irradiation unit 8 includes unillustrated focal point position adjusting means, and adjusts in the Z direction the position of the focal point of the laser beam LB1+LB2 focused by the condenser 86.

The laser processing machine 2 according to the present invention has the configuration as generally described above, and its operations will be hereinafter described.

When performing laser processing by the laser processing machine 2 of this embodiment, a plate-shaped workpiece, for example, the wafer 10, which is made from silicon (Si) and carries devices formed on the front side thereof, supported on the annular frame F via the adhesive tape T as depicted in FIG. 1 is provided. After the wafer 10 has been provided, the wafer 10 is placed, with the front side with the devices formed thereon facing upward, on the suction chuck 35 of the chuck table 34, the undepicted suction means is operated, and the annular frame F is fixed by the clamps 36 or the like.

After the wafer 10 has been held on the suction chuck 35, the chuck table 34 is moved in the X and Y directions by the moving mechanism 23 as needed to position the wafer 10 on the chuck table 34 right below the alignment unit 90. After the wafer 10 has been positioned right below the alignment unit 90, the wafer 10 is imaged from above by the alignment unit 90. Based on an image of the wafer 10 as captured by the alignment unit 90, a position on the wafer 10, where processing is to be performed, is next detected by a method such as pattern matching (alignment step). By moving the chuck table 34 based on position information acquired by this alignment step, the condenser 86 is positioned above a processing start position on the wafer 10.

After the alignment between the condenser 86 and the wafer 10 has been performed, the water W is replenished to the water supply system 4 as needed and sufficiently, and the water supply pump 44 is operated. As the water W that circulates in the water supply system 4, pure water may be used, for example.

Figure 5:
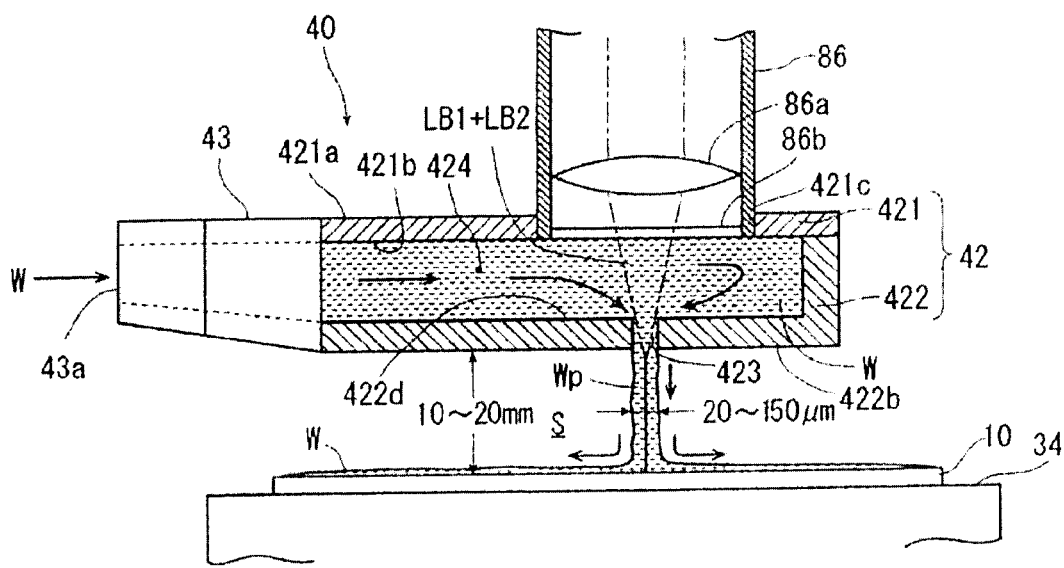
FIG. 5 is a partly enlarged cross-sectional diagram illustrating an operation state of the water pillar forming means, which is mounted on the laser processing machine depicted in FIG. 1, at the time of processing.

FIG. 5 presents a partly enlarged cross-sectional view of the water pillar forming unit 40 sectioned along A-A indicated in FIG. 3, and also illustrates a mode that performs laser processing by irradiating the laser beam LB1+LB2 while introducing the pressurized water W and forming a water pillar Wp. As appreciated from FIG. 5, the water pillar forming unit 40 of the water supply system 4 is disposed on the lower end portion of the condenser 86, and is set so that, when the focal point of the laser beam LB1+LB2 is positioned at the height of the front side of the wafer 10, a water pillar forming region S of, for example, approximately 10 to 20 mm high is formed between the lower surface 422b of the casing 42 of the water pillar forming unit 40 and the front side of the wafer 10.

As the water supply system 4 has the above-described configuration, the water W delivered from the delivery port 44a of the water supply pump 44 is supplied to the water pillar forming unit 40. The water W supplied to the water pillar forming unit 40 is introduced into the space 424 of the casing 42 via the pressurized water introducing portion 43, and is ejected downward from the ejection hole 423 formed through the bottom wall 422d. The water W ejected from the ejection hole 423 forms the thread-shaped water pillar Wp in the water pillar forming region S between the lower surface 422b of the casing 42 and the wafer 10 as illustrated in FIG. 5. Thereafter, the water W flows on the wafer 10 and flows out of the chuck table 34, flows through the above-described water recovery channel 70 of the water recovery pool 60, and is collected in the water drain hole 65 formed in the water recovery channel 70. The water W collected in the water drain hole 65 is guided to the filter 45 by way of the pipe 46b, is cleaned at the filter 45, is returned to the water supply pump 44, and is allowed to circulate in the water supply system 4. The space 424 filled with the water W delivered from the water supply pump 44 has a pressure of 2 to 50 MPa, for example, and the thread-shaped water pillar Wp formed with the water W ejected from the ejection hole 423 has a diameter of 20 to 150 µm, for example.

With the water W stably circulating in the water supply system 4 and the water pillar Wp being formed, the laser beam irradiation unit 8 is operated and the X-direction moving mechanism 50, which configures the moving mechanism 23, is operated, whereby the holding unit 22 and the laser beam irradiation unit 8 are relatively moved at a predetermined moving speed in the processing feed direction (the X direction) from the above-described processing start position.

Figure 6:
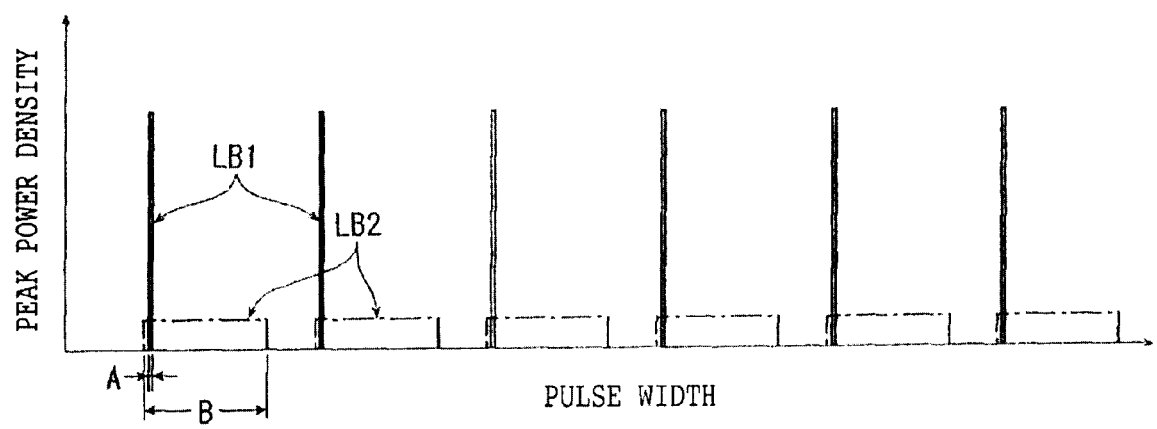
FIG. 6 is a timing chart schematically illustrating the pulse widths of first and second laser beams and also illustrating irradiation timings.

Now, a description will be made in further detail, with reference to FIGS. 6, 7A and 7B in addition to FIG. 5, about laser processing to be realized by the laser beam irradiation unit 8 of this embodiment. As illustrated in FIG. 5, the laser beam LB1+LB2 irradiated from the condenser 86 passes through the space 424, which is filled with the water W, and the ejection hole 423 of the water pillar forming unit 40, is allowed to transmit in the water pillar Wp, and is irradiated to a position (a desired street) on the wafer 10, where the processing is to be performed. The laser beam LB1+LB2 is the combination of the first laser beam LB1 and the second laser beam LB2 as described above. As illustrated in FIG. 6, the first laser beam LB1 is set to have an extremely short pulse width A, the second laser beam LB2 is set to have a pulse width B longer than the first laser beam LB1, and the second laser beam LB2 is irradiated so as to synchronize with the first laser beam LB1.

The above-described laser processing conditions for the laser processing machine 2 can be realized, for example, under the following specific processing conditions.

<First Laser Oscillator>

Wavelength of the first laser beam: 355 nm, 532 nm, 1064 nm

Average output: 10 to 30 W

Repetition frequency: 1 to 10 MHz

Pulse width: 50 fs to 50 ps

<Second Laser Oscillator>

Wavelength of the second laser beam: 355 nm, 532 nm, 1064 nm

Average output: 30 W

Repetition frequency: 1 to 10 MHz

Pulse width: 50 ns

Figure 7A:
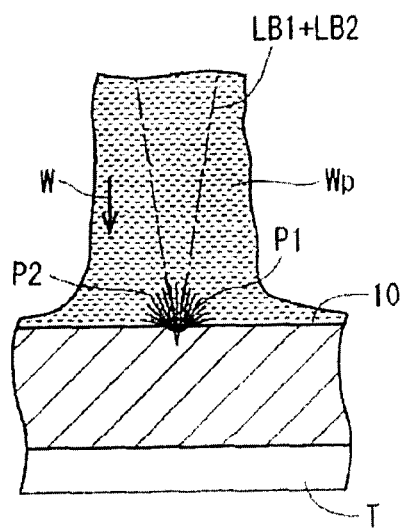
FIG. 7A is a partly enlarged cross-sectional view illustrating plasmas occurred when processing is applied to a wafer by the laser beams illustrated FIG. 5.
Figure 7B:
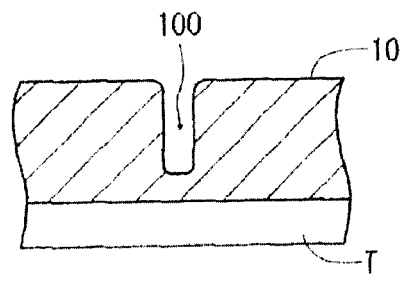
FIG. 7B is a partly enlarged cross-sectional view illustrating a processed groove obtained as a result of the processing in FIG. 7A.

As appreciated from FIGS. 6 and 7A, the second laser beam LB2 is irradiated so as to be introduced into a first plasma P1 occurred in a vicinity of the front side of the wafer 10 as a result of irradiation of the first laser beam LB1 to the position of the wafer 10 where processing is to be performed. In this embodiment, as described based on FIG. 6, the first laser beam LB1 is set have the extremely short pulse width, and the second laser beam LB2 is set to have the pulse width longer than the first laser beam LB1. In other words, the first laser beam LB1 is set have a high peak power density, and the second laser beam LB2 is set to have a peak power density significantly lower than the first laser beam LB1.

If the laser beam LB1+LB2 is irradiated to the wafer 10 as described above, the first plasma P1 occurs in the vicinity of the front side of the wafer 10 as the result of the irradiation of the first laser beam LB1 of the high peak power density and short pulse width as illustrated in FIG. 7A. Further, the second laser beam LB2 is irradiated toward the first plasma P1 because the second laser beam LB2 is irradiated so as to synchronize with the first laser beam LB1. As a consequence, the energy of the second laser beam LB2 is guided to the first plasma P1, and therefore the first plasma P1 is allowed to grow into a second plasma P2. The laser beam LB1+LB2 is then irradiated along the desired street, and as illustrated in FIG. 7B, laser processing that is excellent in isotropy is applied toward a location underneath the irradiation position, whereby the wafer 10 is processed deeper to form a fine cylindrical hole. Then, by moving the holding unit 22 in the processing feed direction (the X direction), the processed groove 100 is formed to a desired depth along the desired street. During this processing, bubbles occur by the irradiation of the laser beam LB1+LB2. However, these bubbles are caused to collapse by the pressure of the water pillar Wp, are promptly expelled together with the water W of the water pillar Wp from the processing region for the wafer 10, and therefore do not interfere with the intermittently irradiated laser beam LB1+LB2.

Even if debris particles are released from the front side of the wafer 10 into the water W, such debris particles are promptly expelled together with the above-described bubbles. The water W with the above-described bubbles and debris particles contained therein flows on the cover plate 33 and the water covers 66, and is guided into the water recovery channel 70 of the water recovery pool 60, as mentioned above. The water W guided into the water recovery channel 70 flows through the water recovery channel 70 while externally releasing the bubbles occurred by the laser processing, and is drained from the water drain hole 65 formed at the deepest portion of the water recovery channel 70. The water W drained from the water drain hole 65 is guided to the filter 45 by way of the pipe 46b, and is again supplied to the water supply pump 44. Since the water W circulates in the water supply system 4 as described above, debris particles, fine powder, dust, and the like are appropriately captured by the filter 45, and hence the water W is maintained in a clean state.

After the above-described laser processing has been performed along the desired street in the first direction, the moving mechanism 23 is operated to position the condenser 86 above one end portion of another street which is adjacent in the Y direction the desired street already subjected to the laser processing and has not been processed, and laser processing similar to the above-described laser processing is performed. After such laser processing has been performed on all the streets formed in the first direction, the chuck table 34 is rotated by 90°, and similar laser processing is also performed on streets which extend in the second direction, intersect at right angles with the already-processed streets in the first direction, and have not been processed yet. In the manner as described above, laser processing can be performed along all the streets on the wafer 10 to form the processed grooves 100 as starting points for division.

In this embodiment, as described above, the laser beam LB1+LB2 is allowed to transmit in the water pillar Wp and is irradiated to the desired irradiation position, whereby processing is applied by the second plasma P2 grown from the first plasma P1. If processing is applied only by a laser beam having a short pulse width like the first laser beam LB1, on the other hand, there is anisotropy in the processing direction, so that the processed portion has a V-shaped cross-sectional shape and the processing speed abruptly decreases as the processing proceeds in a depth direction from the front side. If the laser beam LB1+LB2 as the combination of the first laser beam LB1 having the short pulse width and the second laser beam LB2 having the long pulse width is irradiated as in this embodiment, however, the processing is excellent in isotropy. As described based on FIG. 7, the wafer 10 is hence processed deeper downwardly of the irradiation position to form a fine cylindrical hole without a reduction in processing speed. In this manner, the processed groove 100 can be formed at a preferred processing speed to a desired depth along each street.

According to this embodiment, the sticking of debris particles to the front side of the wafer 10 can be prevented without applying a liquid resin to the front side of the wafer, thereby enabling to cut off the cost of the liquid resin and also to save the labor involved in applying and removing the liquid resin and hence to make improvements in productivity.

Further, the first laser beam LB1 is allowed to transmit in the water pillar Wp formed by the water pillar forming unit 40, and is irradiated to the wafer 10 so that the first plasma P1 occurs. At this time, the first plasma P1 occurs confined in a layer of the water W that is flowing down as the water pillar Wp, so that the first plasma P1 is suppressed from excessively spreading and effects of heat are alleviated. On the other hand, the second laser beam LB2 is absorbed in the first plasma P1 produced by the first laser beam LB1 having the short pulse width, so that the second plasma P2 occurs in the layer of the water W, which is flowing down as the water pillar Wp, and applies processing. Compared with the case in which laser processing is performed only by the second laser beam LB2, the effects of heat as applied to surroundings of each street on the wafer 10 are limited, leading to improvements in flexural strength when the wafer 10 is divided into individual device chips. By combining the first laser beam LB1 and the second laser beam LB2, allowing the laser beam LB1+LB2 to transmit in the water pillar Wp and irradiating the laser beam LB1+LB2 to the wafer 10 as in this embodiment, excellent laser processing is feasible compared with a case in which one of the first laser beam LB1 and the second laser beam LB2 is irradiated alone to perform laser processing.

According to the present invention, a variety of modifications can be provided without being limited to the above-described embodiment. In this embodiment, the description is made with a premise that the second laser beam LB2 is, for example, a pulsed laser beam, but the present invention is not limited to such a premise. The second laser beam LB2 may be a laser beam of continuous wave (CW), because it is needed for the second laser beam LB2 to be a laser beam irradiated with a pulse width longer than the pulse width of the first laser beam LB1. Therefore, laser beams of continuous wave (CW) are encompassed by the term "second laser beam having a long pulse width" as used in this invention.

In the embodiment described above, the second laser beam LB2 is outputted so as to synchronize with the first laser beam LB1. Further, as illustrated in FIG. 6, the first laser beam LB1 and the second laser beam LB2 are described to be emitted from the first laser oscillator 812 and the second laser oscillator 814, respectively, so that the second laser beam LB2 is outputted concurrently with the first laser beam LB1. However, the present invention is not limited to such a mode. For example, the present invention embraces a mode that irradiates the second laser beam LB2 after irradiation of the first laser beam LB1 and before extinction of the first plasma P1 produced by the first laser beam LB1. As described above, even after the first laser beam LB1 has been irradiated, the emission of the second laser beam LB2 from the second laser oscillator 814 before the extinction of the first plasma P1 can bring about similar advantageous effects as those described above.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A laser processing machine comprising:
   a chuck table configured to hold a plate-shaped workpiece,
   a laser beam irradiation unit configured to irradiate a laser beam to the workpiece held on the chuck table so that processing is applied to the workpiece, and
   a processing feed mechanism configured to perform relative processing feed of the chuck table and the laser beam irradiation unit,
   wherein the laser beam irradiation unit includes:
   a laser oscillator that emits the laser beam,
   a condenser that condenses the laser beam emitted from the laser oscillator and irradiates to the workpiece held on the chuck table,
   a water pillar forming unit disposed on a lower end of the condenser and configured to form a thread-shaped water pillar on a front side of the workpiece,
   a water recovery pool configured to collect water, and
   a water supply pump configured to supply water from the water recovery pool to the water pillar forming unit,
   wherein the laser oscillator includes a first laser oscillator, which emits a first laser beam having a short pulse width, and a second laser oscillator, which emits a second laser beam having a long pulse width,
   wherein, after the first laser beam emitted from the first laser oscillator and the second laser beam emitted from the second laser oscillator have transmitted through the thread-shaped water pillar and have been irradiated to the workpiece, a plasma produced by
   the first laser beam emitted from the first laser oscillator grows by absorption of energy from the second laser beam emitted from the second laser oscillator, and applies processing to the workpiece, and
   wherein the water recovery pool collects excess water from the water pillar forming unit.

2. The laser processing machine according to claim 1, wherein:
   the water pillar forming unit includes a casing and a pressurized water introducing portion that introduces pressurized water into the casing, the casing having a top wall which faces an object lens configuring the condenser, a bottom wall which opposes the top wall and includes an ejection hole formed therethrough, and a side wall surrounding a space formed by the top wall and the bottom wall, and
   the first laser beam and the second laser beam are guided by the thread-shaped water pillar ejected from the ejection hole formed through the bottom wall, and are irradiated to the workpiece.

3. The laser processing machine according to claim 1, wherein said water recovery pool includes an outer frame and a drain hole, said outer frame defining a channel that directs the water to the drain hole.

4. The laser processing machine according to claim 3, wherein said drain hole is connected to a filter configured to clean the water.

5. The laser processing machine according to claim 3, wherein said water recovery pool includes two covers, said chuck table being positioned between said two covers.

6. A laser processing machine comprising:
   a chuck table configured to hold a plate-shaped workpiece, a laser beam irradiation unit configured to irradiate a laser beam to the workpiece held on the chuck table so that processing is applied to the workpiece, and a processing feed mechanism configured to perform relative processing feed of the chuck table and the laser beam irradiation unit, wherein the laser beam irradiation unit includes:

a laser oscillator that includes a first laser oscillator, which emits a first laser beam having a short pulse width, and a second laser oscillator, which emits a second laser beam having a long pulse width, a beam splitter that combines the first laser beam and the second laser beam and outputs the first laser beam and the second laser beam as the laser beam, a condenser that condenses the laser beam emitted from the laser oscillator and combined by the beam splitter and irradiates to the workpiece held on the chuck table, a water pillar forming unit disposed on a lower end of the condenser and configured to form a thread-shaped water pillar on a front side of the workpiece, a water recovery pool configured to collect water, and a water supply pump configured to supply water from the water recovery pool to the water pillar forming unit, wherein, after the first laser beam emitted from the first laser oscillator and the second laser beam emitted from the second laser oscillator have transmitted through the thread-shaped water pillar and have been irradiated to the workpiece, a plasma produced by the first laser beam emitted from the first laser oscillator grows by absorption of energy from the second laser beam emitted from the second laser oscillator, and applies processing to the workpiece.

\* \* \* \* \*